United States Patent [19]

Hövelmann

[11] Patent Number: 4,759,044
[45] Date of Patent: Jul. 19, 1988

[54] SIMPLIFIED SYNCHRONOUS FORWARD/BACKWARD BINARY COUNTER

[75] Inventor: Rainer Hövelmann, Hamburg, Fed. Rep. of Germany

[73] Assignee: U.S. Philips Corporation, New York, N.Y.

[21] Appl. No.: 945,423

[22] Filed: Dec. 22, 1986

[30] Foreign Application Priority Data

Dec. 21, 1985 [DE] Fed. Rep. of Germany ....... 3545646

[51] Int. Cl.$^4$ ...................... H03K 21/02; H03K 23/56
[52] U.S. Cl. .................................... 377/125; 377/111
[58] Field of Search ................ 377/123, 125, 126, 111

[56] References Cited

U.S. PATENT DOCUMENTS 3,906,195  9/1975  Maejima ............................. 377/125
4,280,190  7/1981  Smith .................................. 377/126
4,509,183  4/1985  Wright ............................... 377/125

Primary Examiner—John S. Heyman
Attorney, Agent, or Firm—Jack Oisher; Steven R. Biren

[57] ABSTRACT

In a binary counter made using the I$^2$L technique, the realization of different gate types is complicated, because only NAND gates can be obtained directly. According to the invention, a particular circuit construction is indicated, which is constructed according to the I$^2$L technique, is very simple and requires only a few gate transit times so that a comparatively high switching speed can be attained. In the circuit construction of the invention, both the flipflops and their associated combinatorial networks are fabricated in the I$^2$L technique, using only NAND gates. Nevertheless, because of the particular circuit configuration of the invention, all of the necessary internal signals can be generated in an efficient manner.

3 Claims, 2 Drawing Sheets

SIMPLIFIED SYNCHRONOUS FORWARD/BACKWARD BINARY COUNTER

BACKGROUND OF THE INVENTION

The invention relates to a circuit arrangement for a synchronous forward/backward binary counter having a counting direction that can be changed over via a directional control signal and having a chain of D flip-flops, to each of which is assigned at least from the second flip-flop in the chain an individual combinatorial network receiving at least a first and a second state signal, whose values are determined by states of the preceding flip-flops, this network supplying, depending upon these state signals and the directional control signal, to the D input of the assigned flip-flop either its non-inverted output signal or its inverted output signal.

Such a circuit arrangement is known from Japanese Patent Application No. 55-166701 (publication No. 57-91034). In this known circuit arrangement, each combinatorial network has two AND gates, an OR gate and an EXCLUSIVE OR gate. The state signals are the output signals of the flip-flops preceding in the chain so that the number of state signals increases from stage to stage and the AND gates must have correspondingly a larger number of inputs. In longer counters this leads to a considerable amount of wiring and voluminous AND gates, which involves difficulties in the case of a construction as an integrated circuit.

For the realization of gates and flip-flops, different techniques are known, for example the bipolar TTL technique or the CMOS technique using field effect transistors. These techniques are distinguished, for example, by their switching speed and more particularly by their power consumption. With the known techniques, particular diffulcities are not involved in constructing different kinds of combinatorial gates.

A certain exception in this respect is the $I^2L$ (Integrated Injection Logic) technique, in which only NAND gates can be realized. Other types of combinatorial gates can be derived therefrom, for example by means of inverters, but this requires a considerable amount of labor. If consequently the aforementioned known circuit arrangement should be realized in $I^2L$ technique in this manner, each combinatorial network becomes very voluminous.

SUMMARY OF THE INVENTION

Therefore, the invention has for its object to provide a circuit arrangement of the kind mentioned above, which is constructed in a very simple manner according to the $I^2L$ technique.

According to the invention, this object is achieved in that, when all the D flip-flops and the combinatorial networks are constructed according to the $I^2L$ technique, an output of both sides of the associated flip-flop is connected to the input of a first and a second inverter, respectively, whose outputs are connected to each other and to the D input, and in that both outputs of the flip-flop are moreover connected to the outputs of two pairs of series-connected third and fourth inverters and fifth and sixth inverters, respectively, while the input of one of the pairs of inverters receives the first state signal having a given binary value if all the preceding flip-flops are in the state "1" and the input of the other of the pairs of inverters receives the second state signal having a given binary value if all the preceding flip-flops are in the state "0" and, depending upon the value of the directional control signal, both inverters of one pair or both inverters of the other pairs are cut off simultaneously.

In such a construction, the required combinatorial functions are realized with particularly little effort because per combinatorial network only a few inverters having a few outputs are required. As is known, according to the $I^2L$ technique, the combinations are realized by the connection of outputs of inverters. As a result, a construction according to the $I^2L$ technique does not always correspond without further expedients to the construction which is simplest with respect to logic combination.

With regard to circuit technique, it is very simple to produce the state signals by direct combination of the corresponding output signals of the preceding flip-flops when using the $I^2L$ technique. A further embodiment of the invention is therefore characterized in that the two state signals are produced for at least a part of the combinatorial networks by the connection of a separated output of all the preceding flip-flops. Thus, no additional inverters are required, but the invertors in the outputs of the flip-flops must have several outputs.

To the contrary, according to another embodiment, the state signals in a combinatorial network can be produced in a simple manner in that a further output of the inverter connected to the non-inverted output of the flip-flop supplies the first state signal and the connection of a further output of the sixth inverter with a separated further inverted output of the flip-flop supplies the second state signal. Also in this case, no further inverters are required, but only additional outputs of already-present inverters have to be provided.

BRIEF DESCRIPTION OF THE DRAWING

In order that the invention may be readily carried out, it will now be described more fully, by way of example, with reference to the accompanying drawing, in which.

DESCRIPTION OF THE PREFERRED EMBODIMENTS

Figure 1:
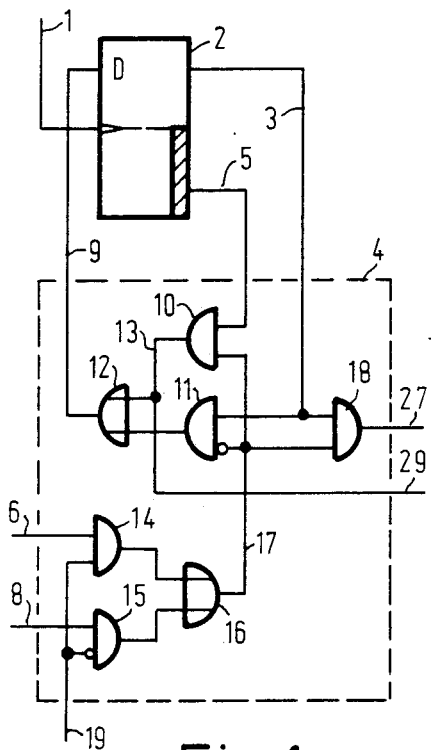
FIG. 1 shows a logic construction of a combinatorial network according to the invention together with the associated flip-flop.

The output signals of both sides of the D flip-flop 2 are supplied through the conductors 3 and 5 to the combinatorial network 4 and further two state signals are supplied to this network through the conductors 6 and 8, the state signal having the value "1" at the conductor 6 indicating that all the preceding flip-flops are in the state "1", while the second state signal having the value "1" at the conductor 8 indicates that all the preceding flip-flops are simultaneously in the state "0". Further, the directional control signal is supplied through the conductor 19, which control signal has the value "1" for the forward counting direction.

The flip-flop 2 is a D flip-flop having the property that the signal supplied through the conductor 9 to the D input is transmitted to the output conductor 3 after the next clock signal supplied through the clock input 1. The output signal at the conductor 5 is inverse to the signal at the conductor 3.

The conductor 6 for the first state signal is connected to one input of an AND gate 14 and the conductor 8 for the second state signal is connected to one input of an AND gate 15. Each time through the other input, the AND gate 14 is opened by a signal value "1" for the directional control signal at the conductor 19 and simultaneously the AND gate 15 is closed, as indicated by the circle at the last-mentioned input, while a signal value "0" at the conductor 19 closes the AND gate 14 and opens the AND gate 15. The output signals of the two AND gates 14 and 15 are combined through the OR gate 16 and are passed on through the conductor 17.

The conductor 5 for the inverted output signal of the flip-flop 2 is connected to one input of an AND gate 10, while the conductor 3 for the non-inverted output signal of the flip-flop 2 is connected to one input of an AND gate 11 and to one input of a gate 18, which will be described hereinafter. The respective other input of the two AND gates 10 and 11 is connected directly and in inverted form, respectively to the conductor 17 so that a signal value "1" at the conductor 17 opens the AND gate 10 and closes the AND gate 11, and conversely. The output signals of the AND gates 10 and 11 are combined through the OR gate 12 and are supplied through the conductor 9 to the D input of the flip-flop 2.

As long as both state signals at the conductors 6 and 8 are low, the signal at the conductor 17 is also low and hence the AND gate 10 is closed and the AND gate 11 is opened, so that the non-inverted output signal of the flip-flop 2 at the conductor 3 is supplied through the AND gate 11 and the OR gate 12 and the conductor 9 to the D input of the flip-flop 2 and the latter does not change its state upon the occurrence of a clock signal at the conductor 1.

If to the contrary the first state signal at the conductor 6 is high, i.e. all the preceding flip-flops are in the state "1" and the directional control signal at the conductor 19 is also high, which corresponds to forward counting, a high signal appears at the output of the AND gate 14 and this signal now closes through the OR gate 16 and the conductor 17 the AND gate 11 and thus opens the AND gate 10 so that the inverted output signal of the flip-flop 2 at the conductor 5 is supplied through the AND gate 10, the OR gate 12 and the conductor 9 to the D input of the flip-flop 2 so that the latter changes its state with the next clock signal at the conductor 1, as is required for binary counting. Subsequently, the first state signal at the conductor 6 becomes low again because the preceding flip-flops also trigger so that the logic state described above is occupied again, in which the flip-flop 2 retains its state at each next clock signal at the conductor 1.

If the second state signal at the conductor 8 is high because all the preceding flip-flops are in the state "0", no high signal appears at the conductor 17 so that no change of state of the flip-flop 2 occurs because the AND gate 15 is closed. If to the contrary the directional control signal at the conductor 19 is low, a high second state signal leads to a high signal at the conductor 17, while in the same manner as described above the flip-flop 2 changes its state at the next clock signal at the conductor 1, as is required for binary backward counting.

The two state signals at the conductors 6 and 8 can be produced by the preceding flip-flops by direct combination of its corresponding output signals. Another possibility is that these state signals are produced by the respective preceding combinatorial network, as is shown in FIG. 1. In fact in the combinatorial network 4, a further AND gate 18 is provided, whose two inputs are connected to the conductor 3 for the non-inverted output signal of the flip-flop 2 and to the conductor 17. If all the flip-flops preceding the flip-flop 2 shown are in the state "1", a high signal appears at the conductor 6, while when the directional control signal at the conductor 19 also has a high signal corresponding to forward counting, a high signal is produced at the conductor 17 through the AND gate 14 and the OR gate 16. If now simultaneously the flip-flop 2 is also in the state "1", the conductor 3 also conveys a high signal and the AND gate 18 supplies correctly a high first state signal to the output 27.

In a corresponding manner, a high signal at the conductor 8 corresponding to all the preceding flip-flops produces in the state "0" with a low directional control signal at the conductor 19 a high signal at the conductor 17 and if simultaneously the flip-flop 2 is in the state "0", the conductor 5 also conveys a high signal so that a high signal appears at the output 13 of the AND gate 10, which signal is supplied as the second state signal through the output 29 to the next network. For this second state signal, no additional AND gate is therefore required.

Figure 2:
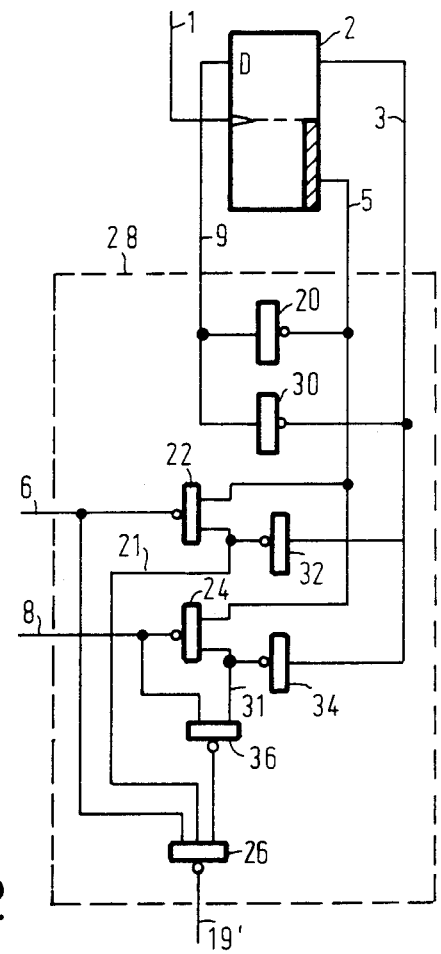
FIG. 2 shows the construction of a combinatorial network according to the $I^2L$ technique.

FIG. 2 shows a combinatorial network 28, which is constructed according to the I²L technique and which fulfils the same functions as the network 4 shown in FIG. 1, apart from the production of the state signals for the succeeding network, but which does not represent a direct transmission of the individual logic combinations of the network 4 shown in FIG. 1. This is due to the particular properties of the I²L technique, by which only NAND gates can be formed directly. This technique in fact utilizes inverters in the form of transistors, into whose base a forward current is injected and which can have several collectors. For the formation of a NAND gate, collectors of at least two different transistors are combined and are connected to the base of a further transistor, whose base current is derived through the collector of one of the combined transistors if this transistor is conducting. As a result, the further transistor is cut off if only one of the combined transistors is conducting.

In FIG. 2 the construction of the D flip-flop is not shown further, but in the said flip-flop, inputs, such as the clock input, lead from the conductor 1 and the D input from the conductor 9 to bases of transistors, while outputs, such as the output conductors 3 and 5, constitute collectors of other transistors.

In the network 28, the individual transistors representing the inverters are shown in simplified form as blocks, whose base input is marked by a circle.

In the case of forward counting, the directional control signal at the conductor 19' of FIG. 2 is low, for example in that this conductor constitutes the collector of a driving transistor in the conducting state, so that the transistor 26 is cut off. This again means that the transistor 36 is conducting and drains the currents flowing through the conductors 8 and 31 so that the transistors 24 and 34 are cut off. If all the preceding flip-flops are in the state "1", a high signal appears at the conductor 6; when defined more precisely, the current injected into the base of the transistor 2 is not drained and because the transistor 26 is also cut off, the transistor 22 is conducting and carries the conductor 5 to a low potential, that is to say that the base current of the transistor 20 is drained so that this transistor is cut off. Moreover, the transistor 32 is cut off by the conducting transistor 22 so that the signal at the conductor 3 is determined only by the output of the flip-flop 2. If the flip-flop 2 is in the state "1", the signal at the conductor 3 is high, while transistor 30 is conducting and the signal at the conductor 9 and hence at the D input of the flip-flop 2 is low. Accordingly, in the state "0" of the flip-flop 2, the conductor 3 is low, while the base current of the transistor 30 is drained so that this transistor is cut off, as a result of which the signal at the conductor 9 and at the D input of the flip-flop 2 is high. Under these given conditions, the conductor 9 therefore always conveys a signal inverse to the signal at the conductor 3.

Since the signal at the inverting output of the flip-flop 2, i.e. the signal at the conductor 5, if it is not made low by another connected collector, is inverse to the signal at the conductor 3, the conductor 9 consequently receives the signal of the inverted output of the flip-flops 2 if in the forward counting direction all the preceding flip-flops are in the state "1" and hence the conductor 6 is high. In all the other states of the preceding flip-flops, however, the conductor 6 is low, the transistor 22 is cut off and the transistor 32 is conducting, so that the inverse signal of the conductor 5 appears at the conductor 9 and hence the signal at the non-inverting output of the flip-flop appears.

If the signal at the directional control conductor 19′ is high, however, which corresponds to backward counting, the transistor 26 is conducting so that the transistors 22 and 32 are always cut off, independently of the state of the preceding flip-flops. Since, however, the transistor 36 is now also cut off, a high signal can occur at the conductor 8 if all the preceding flip-flops are in the state "0". The transistors 24 and 34 now operate in the same manner as described above for the transistors 22 and 32 in the case of forward counting. Thus, the network 28 in FIG. 2 consequently fulfils the same logic function as the network 4 in FIG. 1.

Figure 3:
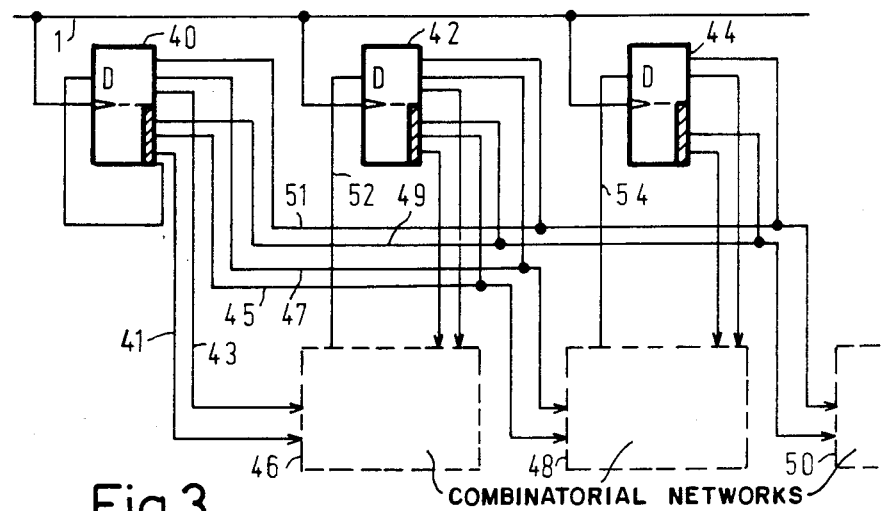
FIG. 3 shows the combination of several flip-flops and associated combinatorial networks upon production of the state signals directly from the output signals of preceding flip-flops.

The state signals for the inputs 6 and 8 of the network 28 in FIG. 2 can be produced by direct combination of outputs of the preceding flip-flops, as is shown in FIG. 3. This Figure shows a multistage binary counter comprising a chain of D flip-flops, but of which only the first three flip-flops 40, 42 and 44 of the chain are represented. Since the first flip-flop 40 changes its state independently of the counting direction with each clock signal at the clock conductor 1, this does not require a combinational network, but one of the inverted outputs of the flip-flop 40 is connected directly to its D input. For the second flip-flop 42 in the chain, a combinational network 46 is provided, which receives the signals from the non-inverting and from the inverted output of the flip-flop 40 through the conductors 41 and 43 directly as state signals and also receives the signals from the two outputs of the associated flip-flop 42 itself and which produces therefrom the signal at the conductor 52 for the D input of the flip-flop 42. The input for the directional control signal is not shown for the sake of clarity.

Accordingly, for the third flip-flop 44 in the chain the combinatorial network 48 is provided. This network receives the state signals via the conductors 45 and 47, which are each connected to an inverted and a non-inverted output, respectively, of the two flip-flops 40 and 42, as a result of which the combination of the states of the flip-flops is formed. Only if the two flip-flops 40 and 42 are in the state "0", the output transistor for the inverted output is not conducting in any of these flip-flops so that no current is drained from the conductor 45 and this conductor can assume a high potential. In a corresponding manner, the conductor 47 can assume a high potential only if the two flip-flops 40 and 42 are in the state "1". Thus, no additional elements are required for the formation of the state signals for the combinatorial network 48.

In a corresponding manner, the two state signals for the combinatorial network 50, which forms part of the fourth flip-flop (not shown) of the chain, are formed at the conductors 49 and 51. Outputs of all three flip-flops 40, 42 and 44 are then connected to these conductors. Also in this case, no further element is required for the formation of the combination of the states of the flip-flops. This also applies to further combinatorial networks if the counter comprises a larger number of stages. However, it can be clearly seen that in this case the amount of wiring increases considerably because for each further stage of the counter and hence for each further combinatorial network a further pair of conductors must extend from all the preceding flip-flops, which are combined in the manner shown, all the flip-flops necessarily having corresponding additional outputs, which from a given number can be fed by one output transistor in the flip-flops so that several output transistors have to be provided. As a result, the construction of longer counting chains becomes much more difficult.

Figures 4, 6:
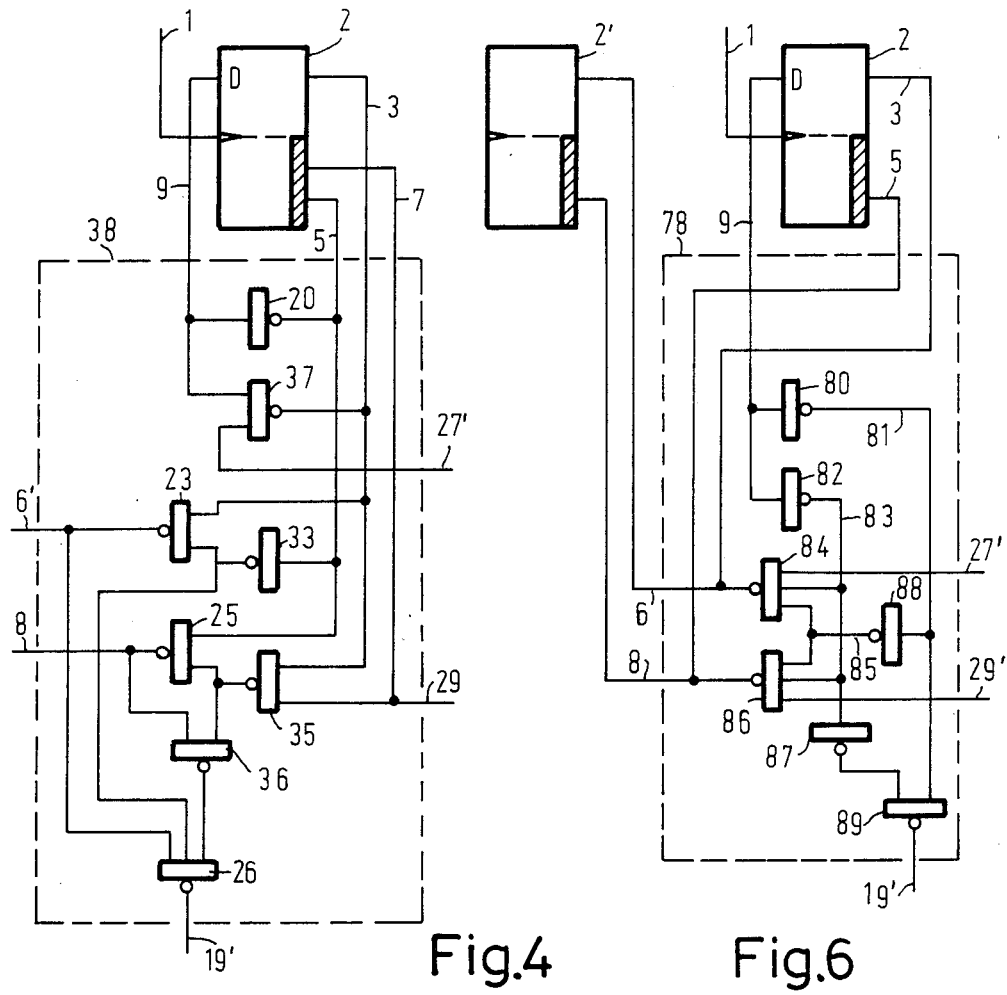
FIG. 4 shows a variation of the combinatorial network for producing the state signals for the succeeding combinatorial network.
FIG. 6 shows another possibility for the construction of the combinatorial network according to the invention in $I^2L$ technique.

A combinatorial network producing the state signals for the respective succeeding combinatorial network is shown in FIG. 4. Thus, a completely modular construction of longer counters is possible. The construction of the combinatorial network 38 shown therein essentially corresponds to the construction of the combinatorial network 28 in FIG. 2, the differences being explained in the following manner. As described in FIG. 2, with a signal at the conductor 6 indicating all the preceding flip-flops simultaneously in the state "1" and with a directional signal at the conductor 19′ corresponding to forward counting, the signal at the conductor 3 and hence the output signal of the transistor 30 determines the signal at the conductor 9. Therefore, the transistor 30 in FIG. 2 is replaced by the transistor 37 in FIG. 4, which has an additional output 27′, which produces the first state signal. If in fact the flip-flop 2 is in the state "1" and all the preceding flip-flops are also in the state "1", the signal at the conductor 3 is high and hence the transistor 37 is conducting so that only under this condition the first state signal at the output 27′ is low. Thus, this state signal is unambiguous, but is inverse to the signal which was assumed for the network 28 in FIG. 2. However, this inversion can be readily taken into account because due to the two transistors 22 and 32 in FIG. 2 the two signal polarities are present. The inversion is then taken into account, as shown in FIG. 4, in that now one output of the transistor 23, which corresponds to the transistor 22 in FIG. 2, is connected to the conductor 3 instead of to the conductor 5, while in a corresponding manner the output of the transistor 33, which corresponds to the transistor 32 in FIG. 2, is connected to the conductor 5. As a result, the inversion at the conductor 6' for the first state signal in FIG. 4 is taken into account so that several combinatorial networks 38 can be combined to a chain.

This also applies to the second state signal for the next stage, which is formed at an output 29 of the combinatorial network 38 by the connection of an additional output 7 of a transistor 35 corresponding to the transistor 34 in FIG. 2 and of an additional inverted output of the flip-flop 2. When the directional control signal at the conductor 19' is high, which corresponds to backward counting, the transistor 26 is conducting and hence the transistor 36 is cut off so that a high signal at the conductor 8, when all the preceding flip-flops are in the state "0", can render the transistor 25 and hence can cut off the transistor 35. If the flip-flop 2 is simultaneously in the state "0", the output 7 does not drain any current either so that at the output 29 the second state signal is high. This state signal also occurs, when the flip-flop 2 is in the state "0", but the directional control signal at the conductor 19' is low, which corresponds to forward counting, because in this case the transistor 35 is cut off by the now-conducting transistor 36. However, this state signal is not evaluated in the next combinatorial network or such a state signal at the input 8 is not evaluated by a combinatorial network preceding the combinatorial network 38 in the combinatorial network 38 because this signal at the conductor 8 is drained through the conducting transistor 36.

Figure 5:
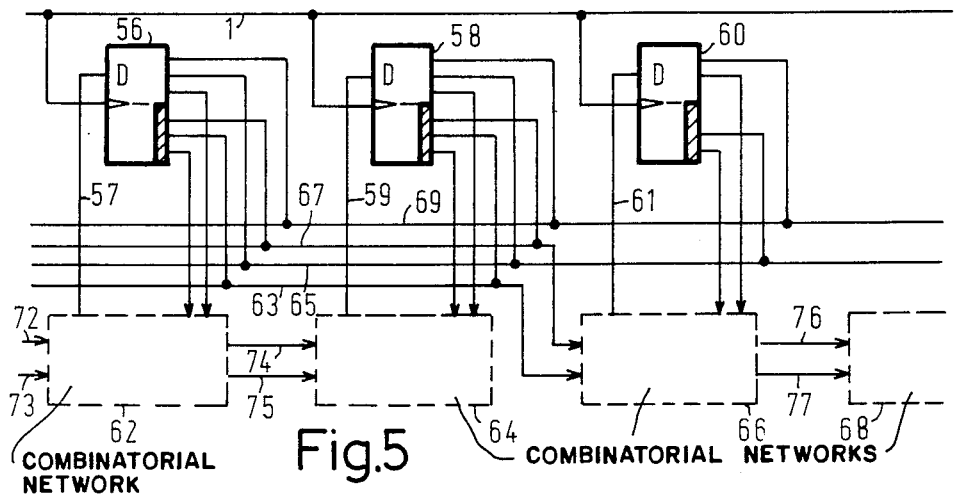
FIG. 5 shows a section of a chain of flip-flops with combinatorial networks with a mixed production of the state signals.

In the combinatorial network 38 in FIG. 4, a signal variation of the state signal at the input 6' appears under corresponding further signal conditions, after having transversed the transistors 23 and 37, at the output 27' and correspondingly a signal variation of the second state signal at the input 8 appears under corresponding other further signal conditions, after having transversed the transistors 25 and 35, at the output 29, i.e. in both cases after having traversed only two transistors. This number of two transistors is also the theoretical minimum for carrying out the required combinations. However, if a longer chain of such combinatorial networks are consecutively arranged, the last combinatorial network in the chain receives the state signals with a correspondingly large delay so that the maximum counting frequency is limited thereby because after a clock signal which has set the preceding flip-flops in the chain to a state after the next flip-flop has to trigger with the next clock signal, this next clock signal is not allowed to appear until the state signal of the first stage has traversed the whole chain. In the arrangement of FIG. 3, this disadvantage does not occur, but this arrangement requires a large amount of wiring and hence occupies a substantial surface area on the semiconductor when manufactured as an integrated circuit. A compromise of both possibilities is obtained in the arrangement shown in FIG. 5. This Figure shows a section with the D flip-flops 56, 58 and 60 of a longer binary counter comprising further preceding and succeeding stages. The combinatorial network 62 for the flip-flop 56 receives the stage signals through the inputs 72 and 73 and produces, in addition to the signal for the D input at the conductor 57, the state signals at the conductors 74 and 75 for the next combinatorial network 64, which is assigned to the flip-flop 58 and produces the signal for the D input at the conductor 59.

The next combinatorial network 66 for the flip-flop 60, however, receives the state signals not from the preceding combinatorial network 64, but from the direct connection of the corresponding output conductors of the preceding flip-flops through the conductors 63 and 67. This combinatorial network 66 produces, in addition to the signal for the D input of the flip-flop 60 at the conductor 61, the state signals for the next combinatorial network 68, for which the associated flip-flop is not shown for the sake of simplicity, at the conductors 76 and 77. The binary counter can therefore be considered to be subdivided into groups of stages or flip-flops, the flip-flops 56 and 58 representing a group or the end of a group and the flip-flop 60 representing the beginning of the next group. Within each group, the state signals are transmitted from one combinatorial network to the next combinatorial network and at the beginning of a group the state signals are formed from the direct combination of the corresponding outputs of the preceding flip-flops. These state signals thus formed are therefore not delayed by any stages outside the flip-flops themselves, while the delay of the state signals within the groups depends upon the length thereof, as a result of which the maximum counting frequency is determined. At a high required counting frequency, only a small number of stages per group can therefore be used so that correspondingly a larger number of groups is then obtained. In the example shown in FIG. 5, the flip-flops 56 and 58 can form part of the end of the first group, while the flip-flop 60 represents the beginning of the second group. The latter group can be followed by a further group, whose first combinatorial network receives the state signals through the conductors 65 and 69. As a result, the subdivision into three groups requires only two pairs of connection conductors, of which one pair extends only to the end of the first group so that the amount of wiring remains limited, while nevertheless a high counting frequency can be attained.

A slightly simpler embodiment of the combinatorial network, which can be used for the second stage of a binary counter (for example as combinatorial network 46 in FIG. 3), is shown in FIG. 6. In this Figure, the inputs 6 and 8 of the combinatorial network 78 for the two state signals are directly connected to two corresponding outputs of the first flip-flop of the chain, which is designated here by reference numeral 2'. The output conductors 3 and 5 of the second flip-flop 2 of the chain are connected in the combinatorial network 78 directly to the corresponding inputs 6 and 8 for the state signals, which each lead to the input of an inverter transistor 84 and 86, respectively. The respective outputs of the two transistors are connected to each other and to the conductor 85, which leads to the input of a further transistor 88. Respective further outputs of the transistors 84 and 86 are connected to each other and to the conductor 83, which leads to the input of a transistor 82. The output of the transistor 88 is connected through the conductor 81 to the input of a transistor 80. The outputs of the transistors 80 and 82 are connected to each other and to the conductor 9, which leads to the D input of the flip-flop 2. The input 19' for the directional control signal leads to a transistor 89, whose one output is connected to the conductor 81 and whose other output is connected through a further inverter transistor 87 to the conductor 83. The transistors 84 and 86 each have a further output, which is passed to the outside through the outputs 27' and 29', respectively, as a state signal for the combinatorial network of the next stage. The inputs of the first flip-flop 2' are not shown further because they can be switched especially in the same manner as those of the flip-flop 40 in FIG. 3.

It should first be assumed that the directional control signal at the input 19' is low so that the transistor 89 is cut off. That is to say that the signal at the conductor 81 is not influenced by the transistor 89 and on the other hand the transistor 87 is consequently conducting, that is to say that the conductor 83 is permanently low in this condition so that the transistor 82 is permanently cut off and the signal at the conductor 9 is not influenced. As a result, from the inputs 6 and 8 only one signal path is possible through the transistors 84 or 86, the transistor 88 and the transistor 80 to the conductor 9.

If the flip-flop 2' is in the state "0", the signal at the input 6 is always low and the transistor 84 is cut off. The signal at the input of the transistor 86 on the contrary is determined by the inverted output signal of the flip-flop 2 at the conductor 5 so that under these conditions the signal at the conductor 9 is the inverted signal of the conductor 5, i.e. the signal of the conductor 3, because of the indicated triple inversion, so that the flip-flop 2 does not change its state with a clock signal at the conductor 1. If to the contrary the flip-flop 2' is in the state "1", the input 8 is permanently low and the transistor 86 is cut off, while the signal at the transistor 84 is determined only by the signal at the conductor 3. Because of the indicated triple inversion, the signal at the conductor 9 at the D input of the flip-flop 2 is thus equal to the inverted output signal at the conductor 5, that is to say that the flip-flop 2 changes its state after the next clock signal at the conductor 1.

If the signal at the directional control input 19' is high, however, which corresponds to backward counting, the transistor 89 is conducting and keeps the signal at the conductor 81 permanently low, as a result of which the transistor 80 is permanently cut off, while moreover the transistor 87 is then cut off so that the signal at the conductor 83 at the input of the transistor 82 is determined by the outputs of the transistors 84 and 86. Thus, only a double inversion by the transistors 84 or 86 and the transistor 82 lies between the inputs 6 or 8 and the conductor 9. If the flip-flop 2' is in the state "1", the input 8 is at low potential, as a result of which the transistor 86 is cut off and the signal at the input of the transistor 84 is determined by the non-inverted output signal of the flip-flop 2 at the conductor 3. Due to the double inversion, this signal is also the signal at the conductor 9 at the D input of the flip-flop 2 so that the latter does not change its state. The transistor 84 is cut off only after the flip-flop 2' has reached the state "0", while the signal at the input of the transistor 86 is determined by the inverted output signal of the flip-flop 2 at the conductor 5, which due to the double inversion is equal to the signal at the conductor 9 so that the flip-flop changes its state with the next clock signal at the conductor 11.

With respect to the state signals for the next combinatorial network at the outputs 27' and 29' it should be noted that the transistor 84 is conducting only if both flip-flops 2' and 2 are in the state "1", while the transistor 86 is conducting only if both flip-flops 2' and 2 are in the state "0". As a result, both outputs 27' and 29' supply the inverted state signal for the next network. This next network may be constructed in a manner similar to that of the network 38 in FIG. 4, in which event solely the connections of the transistors 25 and 35 must be exchanged for the conductors 3 and 5, that is to say that one output of the transistor 25 is connected to the conductor 3 and one output of the transistor 35 is connected to the conductor 5. The other output of the transistor 35, which is connected to the conductor 7 and to the output 29, is then omitted and instead the transistor 25 is provided with a further output, which is connected to the conductor 7 and to the output 29. Thus, the inversion of the second state signal is completely taken into account.

What is claimed is:

1. A circuit arrangement for a synchronous forward-/backward binary counter having a counting direction that can be changed over by a directional control signal and comprising a chain of D flip-flops and a combinatorial network formed of first through sixth inverters associated with at least the second and subsequent flip-flops, said third through sixth inverters being connected as first and second pairs of series-connected inverters, each said network receiving from first and second outputs of all preceding flip-flops a first and a second state signal at respective inputs of said first and second inverter pairs, the values of which are determined by the states of the preceding flip-flops, said network supplying, depending upon the state signals and the directional control signal applied thereto, to the D input of the associated flip-flop either a non-inverted output signal or an inverted output signal, said D flip-flops and said inverters of said combinatorial networks consisting only of NAND gates, outputs from both sides of the associated flip-flop being connected to the input of said first inverter and said second inverter, respectively, the outputs of said first and second inverters being connected to each other and to the D input of the associated flip-flop, said first output of each flip-flop connected to the outputs of said fourth and sixth inverters, and said second output of each flip-flop connected to the outputs of said third and fifth inverters, respectively, while the input of one of the pairs of inverters receives the first state signal having a given binary value when all the preceding flip-flops are in the "one" state and the input of the other of the pairs of inverters receives the second signal having a given binary value when all the preceding flip-flops are in the state "zero" and, depending upon the value of the directional control signal, both inverters of one pair or both inverters of the other pair are cut off simultaneously.

2. A circuit arrangement as claimed in claim 1, characterized in that the two state signals for at least some of the combinatorial networks are produced by the connection of one selected output of all the preceding flip-flops.

3. A circuit arrangement as claimed in claim 1, characterized in that a further output of the inverter connected to the non-inverted output of the flip-flop supplies the first state signal and the connection of a further output of the sixth inverter with a selected further inverted output of the flip-flop supplies the second state signal.

* * * * *